(12) United States Patent
Yang et al.

(10) Patent No.: US 7,839,396 B2
(45) Date of Patent: Nov. 23, 2010

(54) DISPLAY DEVICE

(75) Inventors: Yong-Seok Yang, Asan-si (KR);
Jung-Tae Kang, Suwon-si (KR); Jin-Ho Ha, Suwon-si (KR); Yoon-Soo Kwon, Anyang-si (KR); Joo-Young Kim, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 794 days.

(21) Appl. No.: 11/780,652

(22) Filed: Jul. 20, 2007

(65) Prior Publication Data

US 2008/0018626 A1 Jan. 24, 2008

(51) Int. Cl.
*G09G 5/00* (2006.01)

(52) U.S. Cl. .................. 345/204; 345/519; 361/704; 361/718; 361/719

(58) Field of Classification Search ........... 345/101, 345/106, 204, 519; 349/149, 151, 152; 361/703, 361/704, 709, 712, 715, 718, 719
See application file for complete search history.

(56) References Cited

U.S. PATENT DOCUMENTS

| 6,979,114 | B2 | 12/2005 | Kao |
| 7,315,451 | B2 * | 1/2008 | Kim et al. .................. 361/704 |
| 2002/0048152 | A1 | 4/2002 | Kurihara et al. |
| 2005/0062899 | A1 | 3/2005 | Fukayama et al. |
| 2005/0286228 | A1 | 12/2005 | Kim |
| 2006/0077620 | A1 | 4/2006 | Kim |

FOREIGN PATENT DOCUMENTS

| CN | 1619616 | 5/2005 |
| CN | 1776494 | 5/2006 |
| JP | 10-240152 | 9/1998 |
| JP | 10-333173 | 12/1998 |
| JP | 11-305205 | 11/1999 |
| JP | 2005-091971 | 4/2005 |
| KR | 2000-0014955 | 3/2000 |
| KR | 2005-0004400 | 1/2005 |
| KR | 1020050041068 A | 5/2005 |
| KR | 2005-0065705 | 6/2005 |
| KR | 2005-0087232 | 8/2005 |
| KR | 2005-0113785 | 12/2005 |

OTHER PUBLICATIONS

EP Search Report, EP 07014313.6, dtd Mar. 3, 2009.

* cited by examiner

*Primary Examiner*—Abbas I Abdulselam
(74) *Attorney, Agent, or Firm*—Innovation Counsel LLP

(57) ABSTRACT

In accordance with an embodiment of the present invention, a display device is provided that includes a display panel configured to display an image, a plurality of driver integrated circuit packages that include a base film and an integrated circuit chip mounted on the base film and of which one side is attached to an edge of the display panel, and a supporting member that fixedly supports the display panel. The supporting member includes a supporting body that fixedly supports the display panel, and a contact heat dissipating portion that protrudes from the supporting body and comes in contact with the driver integrated circuit packages in an area where the integrated circuit chip is formed.

16 Claims, 6 Drawing Sheets

DISPLAY DEVICE

CROSS-REFERENCE TO RELATED APPLICATION

This application claims priority to patent application No. 10-2006-0068399 filed in the Korean Intellectual Property Office, Republic of Korea, on Jul. 21, 2006, and all the benefits accruing therefrom under 35 U.S.C. §119, the contents of which are herein incorporated by reference in their entirety.

BACKGROUND OF THE INVENTION (a) Field of the Invention

The present invention relates to a display device, and more particularly to a display device that can effectively dissipate heat generated in an integrated circuit.

(b) Description of the Related Art

Various types of display devices are in common use today. With the rapid advances in semiconductor technologies, a liquid crystal display (LCD) has become prominent as a representative display device having improved capability while also being compact in size and lightweight. Since the LCD typically includes advantages such as being compact in size, light in weight, and having low power consumption, the LCD has gradually emerged as a substitute for the conventional cathode ray tube (CRT) display. The LCD is currently being employed in many information processing devices requiring a display device. Examples of such devices include not only small scale products such as mobile phones, personal digital assistants (PDAs), and portable multimedia players (PMPs), but also medium and large scale products such as monitors and television sets. Moreover, recently, there has been a growing demand for a display device having higher resolution.

The typical display device having an LCD display generally includes a display panel for displaying an image, a driver integrated circuit package attached to an edge of the display panel, and a printed circuit board electrically connected to the display panel through the driver integrated circuit package. In order for the display panel to display an image with high resolution, a large amount of data is transmitted to the display panel. Thus, a large amount of data is transmitted through an integrated circuit chip mounted on the driver integrated circuit package, which may lead to significant heat generation in the integrated circuit chip. In addition, the integrated circuit chip mounted on a control circuit board also typically generates a large amount of heat.

SUMMARY OF THE INVENTION

One or more embodiments of the present invention provide a display device that can effectively dissipate heat generated in an integrated circuit chip of a driver integrated circuit package. One or more embodiments of the present invention also provide a display device that can effectively dissipate heat generated in an integrated circuit chip of a control circuit board.

According to an embodiment of the present invention, there is provided a display device including a display panel configured to display an image; a plurality of driver integrated circuit packages that include a base film and an integrated circuit chip mounted on the base film and of which one side is attached to an edge of the display panel; and a supporting member that fixedly supports the display panel. The supporting member includes a supporting body that fixedly supports the display panel; and a contact heat dissipating portion that protrudes from the supporting body and comes in contact with the driver integrated circuit packages in an area where the integrated circuit chip is formed.

In the aforementioned embodiment of the present invention, the contact heat dissipating portion may come in contact with an opposite side of a surface of the base film where the integrated circuit chip is mounted. In addition, the supporting body may include a front portion that forms a display window for exposing a front surface of the display panel, and a lateral portion that extends from the front portion.

In the aforementioned embodiment of the present invention, the display device may further include a supporting frame that includes a panel supporting portion that supports edges of the display panel and faces the front portion of the supporting member, and a lateral portion that extends from the panel supporting portion and faces the lateral portion of the supporting member. The driver integrated circuit packages, which are disposed between the front portion of the supporting member and the panel supporting portion of the supporting frame and between the lateral portion of the supporting member and the lateral portion of the supporting frame, may be elastically curved. The driver integrated circuit packages may include curved outer surfaces, and contact heat dissipating portions of the supporting member may press against the curved outer surfaces of the driver integrated circuit packages.

Further, the contact heat dissipating portions may protrude from the lateral portion of the supporting member toward the lateral portion of the supporting frame so as to come in contact with the base film in an area where the integrated circuit chip is mounted. The supporting frame may further include a circuit chip protecting groove that is formed on a surface of the lateral portion facing the contact heat dissipating portion. The contact heat dissipating portions may protrude from the front portion of the supporting member towards the panel supporting portion of the supporting frame so as to come in contact with the base film in an area where the integrated circuit chip is mounted. The supporting frame may further include a circuit chip protecting groove that is formed on a surface of the panel supporting portion facing the contact heat dissipating portion. The display device may further include a printed circuit board connected to a second side of one or more of the plurality of driver integrated circuit packages. The printed circuit board may be located between the lateral portion of the supporting frame and the lateral portion of the supporting member.

According to another embodiment of the present invention, there is provided a display device including a display panel configured to display an image; a receiving member configured to receive a rear surface of the display panel; a control circuit board disposed at a rear surface of the receiving member and includes an integrated circuit chip; and a cover member configured to join with the receiving member to cover the control circuit board. The cover member includes a cover body and a thermal conductive portion protruding from the cover body towards the control circuit board.

In the aforementioned embodiment of the present invention, the display device may further include a heat dissipating pad disposed between the thermal conductive portion of the cover member and the integrated circuit chip of the control circuit board. The heat dissipating pad may have a thickness of between about 0.5 mm to about 2.0 mm. In addition, the cover member may include a material containing a metal component having high thermal conductivity.

Accordingly, the heat generated from the integrated circuit chip of the driver chip package can be effectively dissipated through a contact heat dissipating portion of a supporting member. Further, the heat generated from the integrated circuit chip of a control circuit board can be effectively dissipated.

DETAILED DESCRIPTION OF THE PREFERRED EMBODIMENTS

With reference to the accompanying drawings, embodiments of the present invention will be described in order for those skilled in the relevant art to be able to implement them. The described embodiments may be modified in various different ways, all without departing from the spirit or scope of the present invention. Although a liquid crystal display panel is illustrated in one or more embodiments of the present invention as a display panel used in a display device, this is only an example. Thus, the present invention is not limited thereto. Accordingly, embodiments of the present invention may use not only a light receiving display panel in addition to the liquid crystal display panel but also a light emitting display panel such as a plasma display panel or an organic luminescent display panel.

In addition, although a display device is illustrated that includes a direct type of backlight assembly including a plurality of light source units arranged in a parallel manner, this is only an example. Thus the present invention is not limited thereto. Unnecessary description may be omitted for clarity, and wherever possible, the same reference numbers will be used throughout the drawings to refer to the same or like parts. In the exemplary embodiments, a first embodiment will be representatively described, and a second embodiment will be described by focusing on differences from the first embodiment by using the same reference numbers for the same parts.

Figure 1:
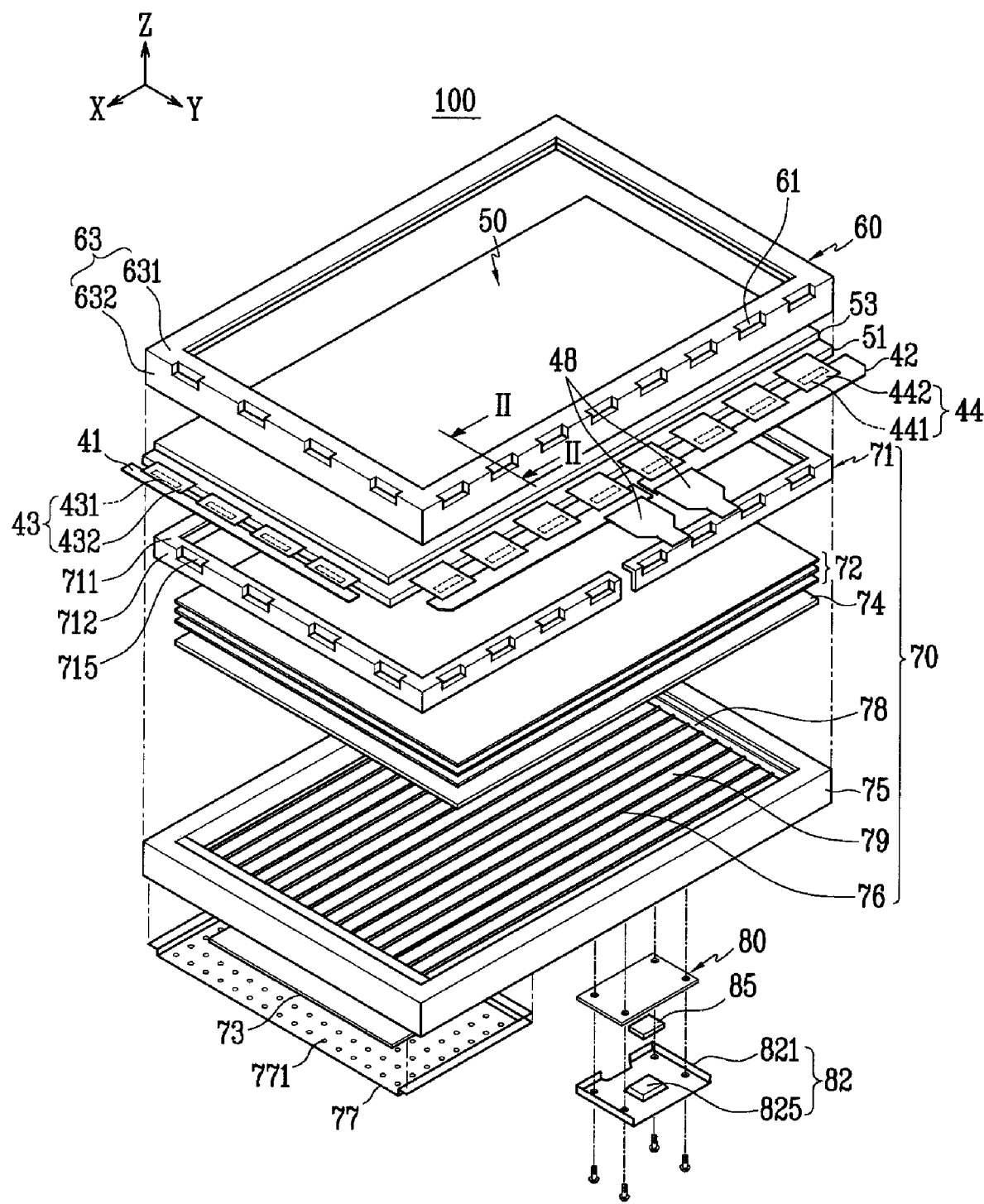
FIG. 1 is an exploded perspective view of a display device according to a first embodiment of the present invention.
Figure 2:
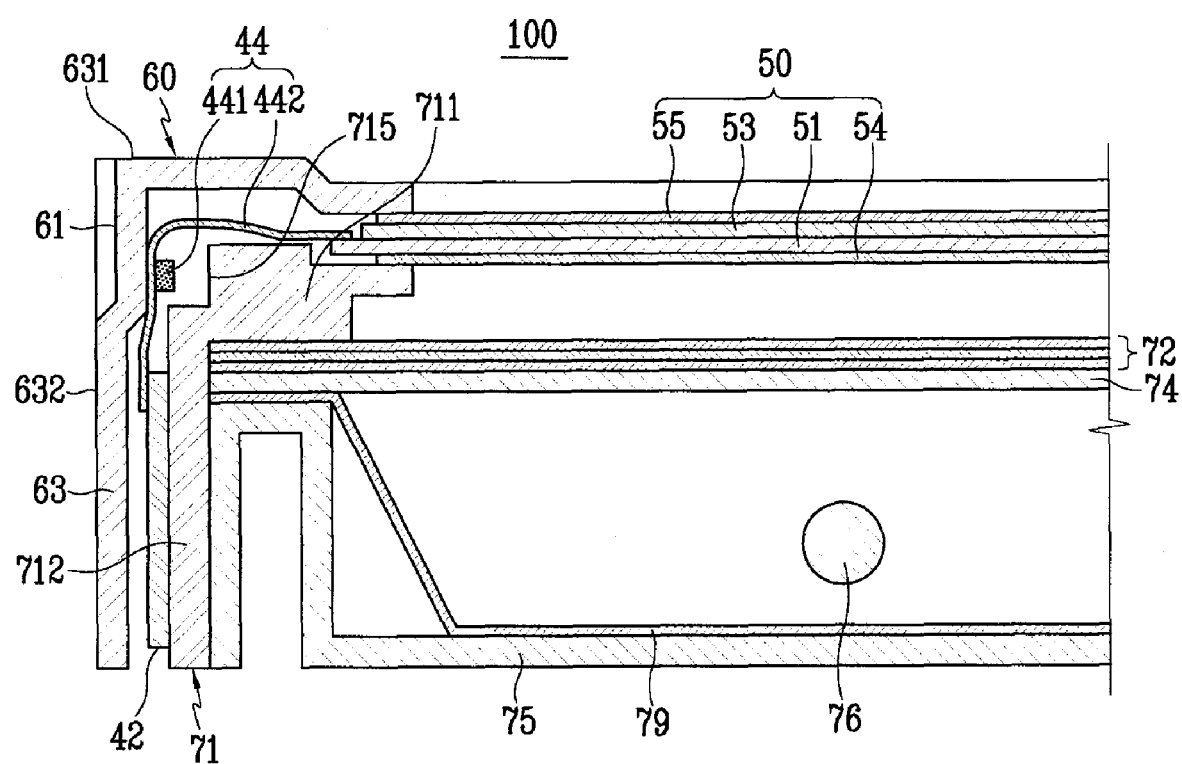
FIG. 2 is a cross-sectional view of an assembled display device taken along line II-II of FIG. 1.

FIGS. 1 and 2 show a display device 100 according to a first embodiment of the present invention. Referring to FIG. 1, the display device 100 mainly includes a backlight assembly 70 that supplies light and a display panel 50 that receives the light so as to display an image. The display device 100 further includes a supporting member 60 that fixedly supports, or fastens, the display panel 50 on the backlight assembly 70 in a fixed or rigid manner. Other elements may be further included in the display device 100. Furthermore, the display device 100 includes a plurality of driver integrated circuit chip packages 43 and 44, which are electrically connected to the display panel 50 to transmit a driving signal, and printed circuit boards 41 and 42. The driver integrated circuit packages 43 and 44 may be a chip on film (COF) package or a tape carrier package (TCP).

The driver integrated circuit packages 43 and 44 include gate driver integrated circuit packages 43 and data driver integrated circuit packages 44. The gate driver integrated circuit packages 43 are attached to one edge of the display panel 50 to supply a gate signal to the display panel 50. The data driver integrated circuit packages 44 are attached to another edge of the display panel 50, which is adjacent to the one edge, to supply other signals including a data signal to the display panel 50. The driver integrated circuit packages 43 and 44 respectively include base films 432 and 442 and integrated circuit chips 431 and 441 mounted on the base films 432 and 442, respectively.

The supporting member 60 includes a supporting body 63 that fixedly supports the display panel 50 in a fixed or rigid manner, and a contact heat dissipating portion 61 that inwardly protrudes from the supporting body 63. The supporting member 60 is made of a metal material or a material having high thermal conductivity. The supporting body 63 includes a front portion 631 that forms a display window whereby a front surface of the display panel 50 is exposed, and a lateral portion 632 that extends in a curved manner from an edge of the front portion 631.

The backlight assembly 70 includes a receiving member 75, a light source unit 76, a light source unit holder 78, a reflection sheet 79, one or more optical sheets 72, and a diffusion plate 74. The light source unit 76, the light source unit holder 78, and the reflection sheet 79 are located in the receiving member 75. The backlight assembly 70 further includes a supporting frame 71 that joins with the receiving member 75 to fixedly support the optical sheets 72 and the diffusion plate 74. The supporting frame 71 also supports the display panel 50 while providing that the display panel 50 is spaced apart from the backlight assembly 70 by a predetermined distance.

The light source unit 76 generates light to be supplied to the display panel 50. The light source unit holder 78 supports both ends of the light source unit 76 to retain the light source unit 76 within the receiving member 75. Although a lamp is shown in FIG. 1 as an example of the light source unit 76, this is only an example since other light sources may be used. Accordingly, a light emitting diode (LED) may be used in the light source unit 76. Alternatively, a linear light source or a surface light source may also be used.

The reflection sheet 79 is located at the bottom surface of the receiving member 75 and reflects light generated from the light source unit 76 so that the light is directed to the display panel 50. The light generated from the light source unit 76 is further diffused when it is reflected by the reflection sheet 79, thereby further improving uniformity of light that reaches the display panel 50. The optical sheet 72 and the diffusion plate 74 improve brightness and uniformity of the light generated from the light source unit 76 and provide the resultant light to the display panel 50. The light emitted from the light source unit 76 is diffused and condensed while passing through the optical sheets 72 and the diffusion plate 74. Thus, the light is diffused and focused, thereby being substantially uniformly dispersed and being converted into light having properties similar to light from a surface light source.

The supporting frame 71 includes a pair of divisional frames. However, the present invention is not limited thereto, and thus an integral-type frame may be used. The supporting frame 71 includes a panel supporting portion 711 that supports an edge of the display panel 50 and faces the front portion 631 of the supporting member 60, and a lateral portion 712 that extends from the panel supporting portion 711 and faces the lateral portion 632 of the supporting member 60. The supporting frame 71 further includes a circuit chip protecting groove 715 that is formed in correspondence with the contact heat dissipating portion 61 of the supporting member 60.

The rear surface of the receiving member 75 is provided with an inverter circuit board 73 and a control circuit board 80. The inverter circuit board 73 is covered with a protection case 77 having a plurality of heat dissipating holes 771. The control circuit board 80 is also covered with a cover member 82. The control circuit board 80 is installed at the receiving member 75 by using screws. The inverter circuit board 73 transforms external power into a constant voltage and thereafter supplies the voltage to the light source unit 76, thereby driving the light source unit 76. The control circuit board 80 is electrically connected to the printed circuit board 42. A signal required to display an image on the display panel 50 is supplied by the control circuit board 80.

The display panel 50 includes a first display panel 51 and a second display panel 53 facing the first display panel 51 with a liquid crystal layer (not shown) interposed therebetween. The first display panel 51 serves as a rear substrate while the second display panel 53 serves as a front substrate. The second display panel 53 is smaller than the first display panel 51 in size. Here, the driver integrated circuit packages 43 and 44 are connected to the display panel 50 in such a manner that one side of the driver integrated circuit packages 43 and 44 are attached to an edge of the first display panel 51 which is not overlapped with the second display panel 53. The other side of one or more of the driver integrated circuit packages 43 and 44 is connected to the printed circuit boards 41 and 42. Although all of the driver integrated circuit packages 43 and 44 are connected to the printed circuit boards 41 and 42 in FIG. 1, the present invention is not limited thereto. The printed circuit board 41 connected to the gate driver integrated circuit package 43 may be omitted. In this case, one side of the driver integrated circuit package 43 is connected to the display panel 50, and the other side thereof is not connected to any element.

Polarizing plates 54 and 55, as shown in FIG. 2, are attached to the rear surface of the first display panel 51 and the, front surface of the second display panel 53 respectively, so as to linearly polarize visible light supplied from the backlight assembly 70. The first display panel 51 and the second display panel 53 are provided with a plurality of thin film transistors (TFTs), a color filter, a pixel electrode, and a common electrode. A liquid crystal layer is located between the pixel electrode and the common electrode. With this structure, when a switching element of TFT is turned on, an electric field is formed between the pixel electrode and the common electrode. A liquid crystal arrangement angle of the liquid crystal layer located between the first display panel 51 and the second display panel 53 varies according to the electric field. Thus, when an optical transmittance changes, a desired image is obtained.

Now, the structure of the display device 100 according to the first embodiment of the present invention will be described in detail with reference to FIG. 2. Although the following descriptions focus on the structures of the data driver integrated circuit package 44 and the printed circuit board 42 connected thereto, the gate driver integrated circuit package 43 and the printed circuit board 41, as shown in FIG. 1, connected thereto have the same structure.

As illustrated in FIG. 2, the printed circuit board 42 is electrically connected to the display panel 50 through the driver integrated circuit package 44. The printed circuit board 42 supplies various signals so as to enable the display panel 50 to display an image. The printed circuit board 42 is located between the lateral portion 712 of the supporting frame 71 and the lateral portion 632 of the supporting member 60. The driver integrated circuit package 44 is arranged to be curved, or flexed, between the front portion 631 of the supporting member 60 and the panel supporting portion 711 of the supporting frame 71 and between the lateral portion 632 of the supporting member 60 and the lateral portion 712 of the supporting frame 71. In this case, since the base film 442 of the driver integrated circuit package 44 includes a material such as a synthetic resin, the driver integrated circuit package 44 can have elasticity, or may exhibit elastic properties, once it is bent. The integrated circuit chip 441 located near the printed circuit board 42 is mounted on the base film 442. Thus, the integrated circuit chip 441 is located between the lateral portion 632 of the supporting member 60 and the lateral portion 712 of the supporting frame 71.

The contact heat dissipating portion 61 of the supporting member 60 protrudes from the lateral portion 632 of the supporting member 60 towards the lateral portion 712 of the supporting frame 71 and thereby comes in contact with the base film 442 in an area where the integrated circuit chip 441 is mounted. That is, the contact heat dissipating portion 61 comes in contact with an opposite side of the surface of the base film 442 where the integrated circuit chip 441 is mounted. When the contact heat dissipating portion 61 directly comes in contact with the integrated circuit chip 441, it may adversely affect the electrical characteristics of the integrated circuit chip 441, resulting in a defect. Further, an electrical short may occur. However, this problem can be prevented by causing the contact heat dissipating portion 61 to come into contact with the base film 442. In addition, the contact heat dissipating portion 61 presses the outer surface of the driver integrated circuit package 44 that is curved or flexed to have elasticity. That is, since the contact heat dissipating portion 61 presses the base film 441 having elasticity when the driver integrated circuit package 44 is curved, the contact heat dissipating portion 61 can further come in close contact with the base film 442 in the area where the integrated circuit chip 441 is mounted. With this structure, heat generated from the integrated circuit chip 441 of the driver integrated circuit package 44 can be effectively dissipated through the contact heat dissipating portion 61 of the supporting member 60. In addition, the supporting frame 71 further includes a circuit chip protecting groove 715 that is formed on a surface facing the contact heat dissipating portion 61 in the lateral portion 712 of the supporting frame 71. That is, the circuit chip protecting groove 715 corresponds to the integrated circuit chip 441 of the driver integrated circuit package 44. Thus, the integrated circuit chip 441 of the driver integrated circuit package 44 that is pressed by the contact heat dissipating portion 61 can be protected against damage caused by collision with the lateral portion 712 of the supporting frame 71 when movement occurs inside the display device 100 or when the display device 100 vibrates.

In FIG. 2, the contact heat dissipating portion 61 of the supporting member 60 is formed across an edge where the lateral portion 632 and the front portion 631 of the supporting body 63 meet. However, the present invention is not limited thereto. Thus, the contact heat dissipating portion 61 may be formed only on the lateral portion 632 of the supporting body 63 to protrude towards the lateral portion 712 of the supporting frame 71. In addition, although the supporting member 60 near the contact heat dissipating portion 61 is not open in FIG. 2, the present invention is not limited thereto. When the contact heat dissipating portion 61 is formed in the supporting member 60 by using a press process or the like, the supporting member 60 near the contact heat dissipating portion 61 may be partially open. That is, when a portion of the supporting member 60 is cut open, the contact heat dissipating portion 61 may be effectively formed by pressing one side of the supporting member 60. Accordingly, when the supporting member 60 near the contact heat dissipating portion 61 is partially open, a light leakage protecting tape (not shown) may be attached to seal the opening portion.

Figure 3:
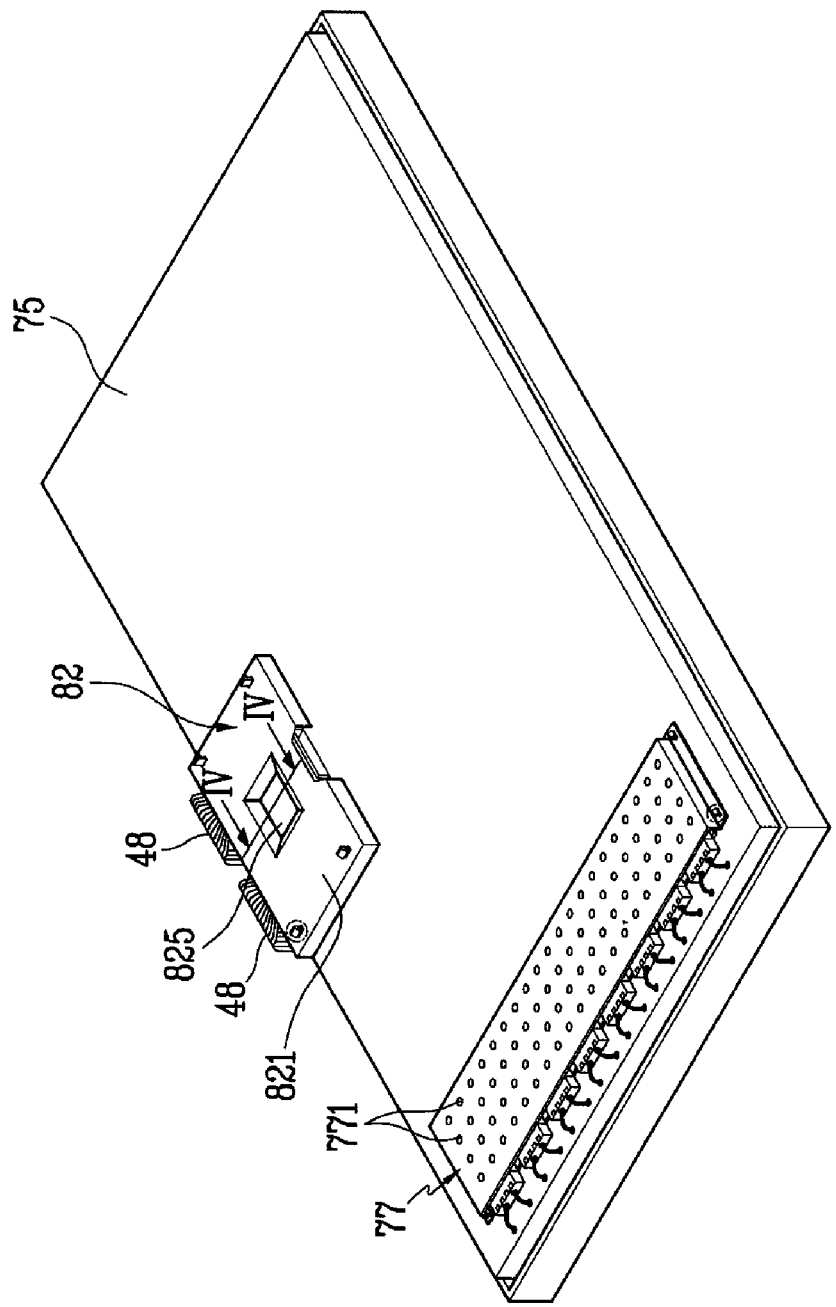
FIG. 3 is a perspective view showing a rear surface of an assembled display device of FIG. 1.
Figure 4:
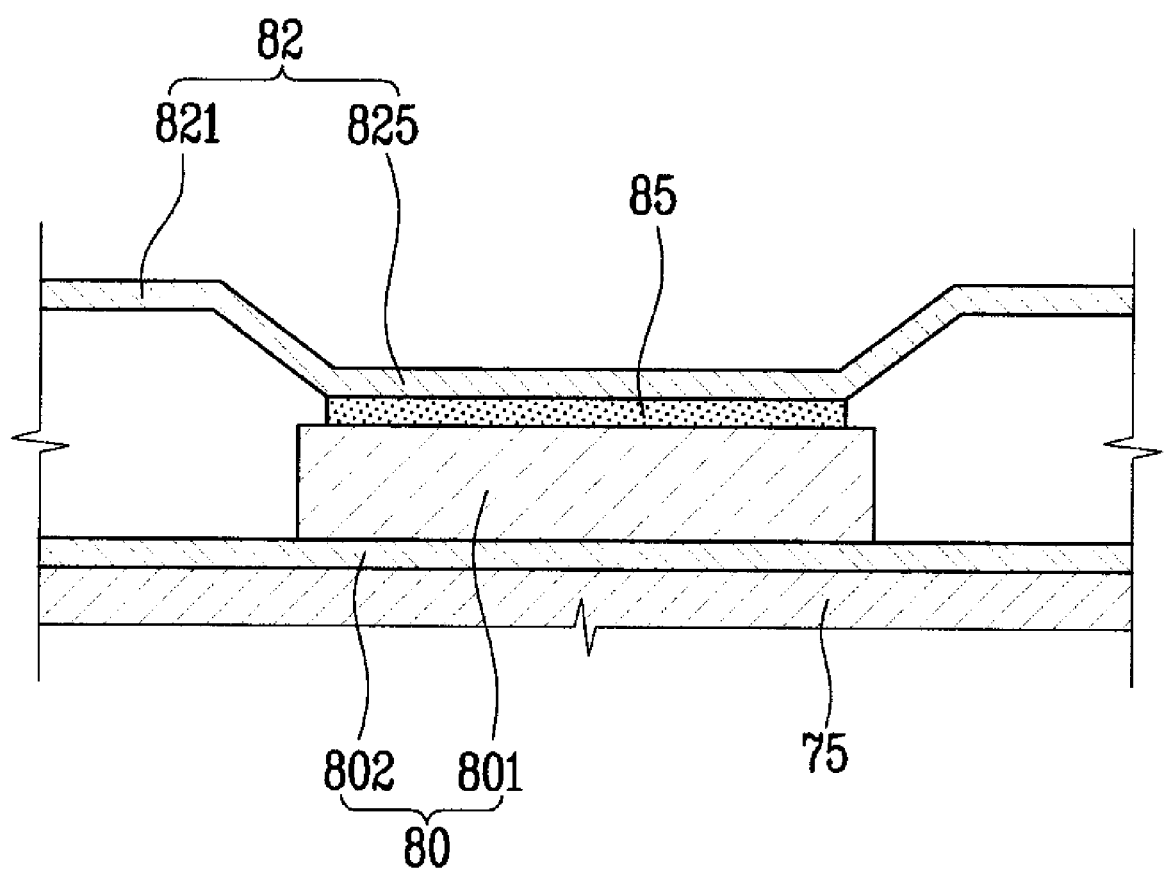
FIG. 4 is a cross-sectional view taken along line IV-IV of FIG. 3.

FIG. 3 is a perspective view showing a rear surface of the assembled display device of FIG. 1, and FIG. 4 is a cross-sectional view taken along line IV-IV of FIG. 3. Referring to FIG. 3, the control circuit board 80, as shown in FIG. 1, is located in a cover member 82 and is connected to the printed circuit board 42 that is connected to the data driver integrated circuit package 44 through a flexible printed circuit film 48. The cover member 82 includes a cover body 821 and a thermal conductive portion 825. Similar to the receiving member 75 and the supporting member 60, the cover member 82 is made of a material containing a metal component having high thermal conductivity.

As illustrated in FIG. 4, the control circuit board 80 includes a circuit board 802 and an integrated circuit chip 801 mounted on the circuit board 802. The thermal conductive portion 825 of the cover member 82 protrudes from the cover body 821 towards the control circuit board 80 so as to be connected to the integrated circuit chip 801 of the control circuit board 80 in a thermally conductive manner. In addition, a heat dissipating pad 85 is located between the thermal conductive portion 825 of the cover member 82 and the integrated circuit chip 801 of the control circuit board 80. With this structure, heat generated from the integrated circuit chip 801 of the control circuit board 80 is thermally transferred through the thermal conductive portion 825 of the cover member 82 and thus is dissipated externally. The heat dissipating pad 85 not only improves thermal conductivity between the thermal conductive portion 825 and the integrated circuit chip 801 but also protects the integrated circuit chip 801 against impact and external pressure. In this case, the heat dissipating pad 85 has a thickness of between about 0.5 mm (millimeters) to about 2.0 mm. If the thickness of the heat dissipating pad 85 is less than about 0.5 mm, heat dissipation and impact alleviation become less effective. If the thickness of the heat dissipating pad 85 is greater than about 2.0 mm, heat dissipation and productivity become less effective.

Figure 5:
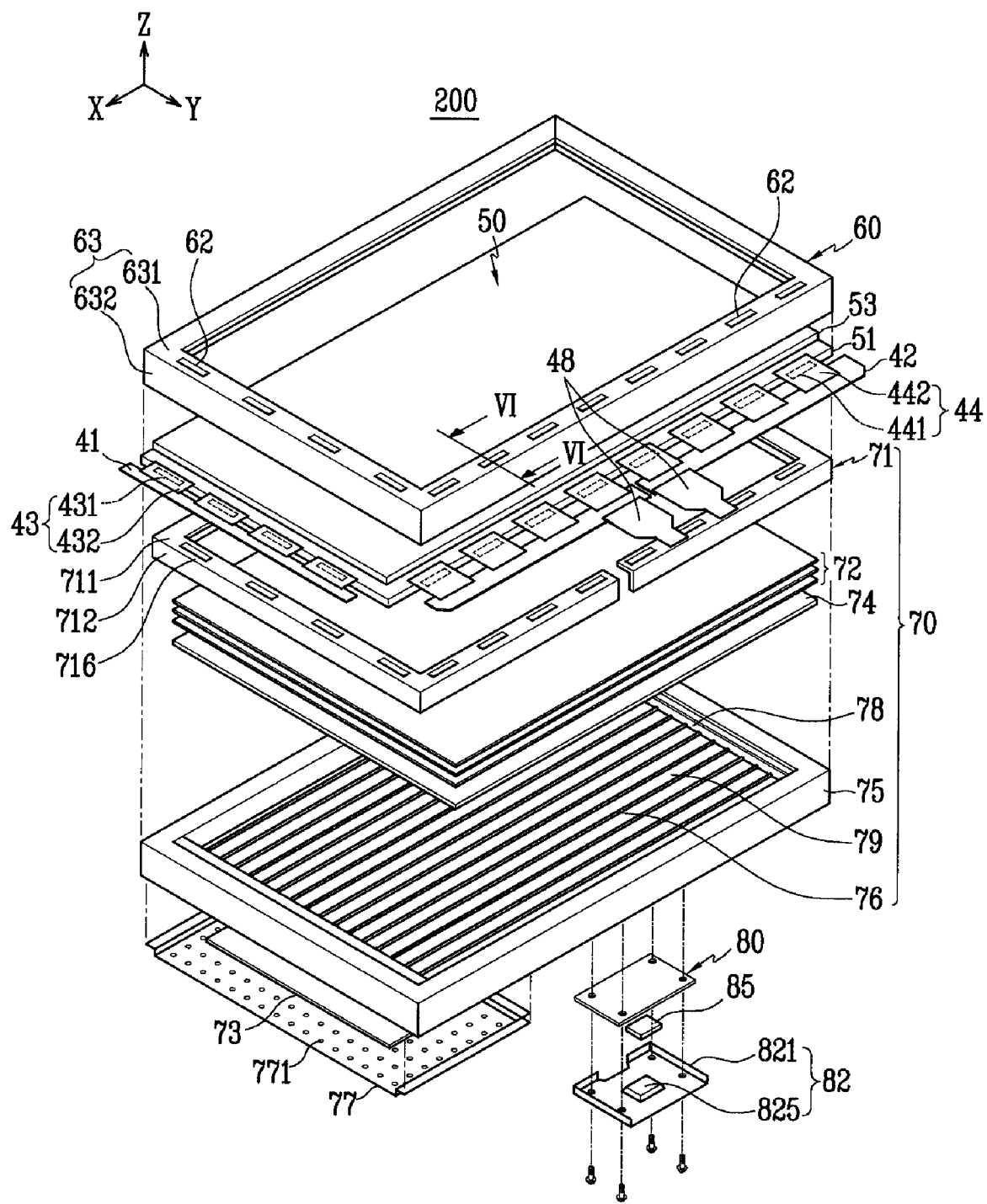
FIG. 5 is an exploded perspective view of a display device according to a second embodiment of the present invention.
Figure 6:
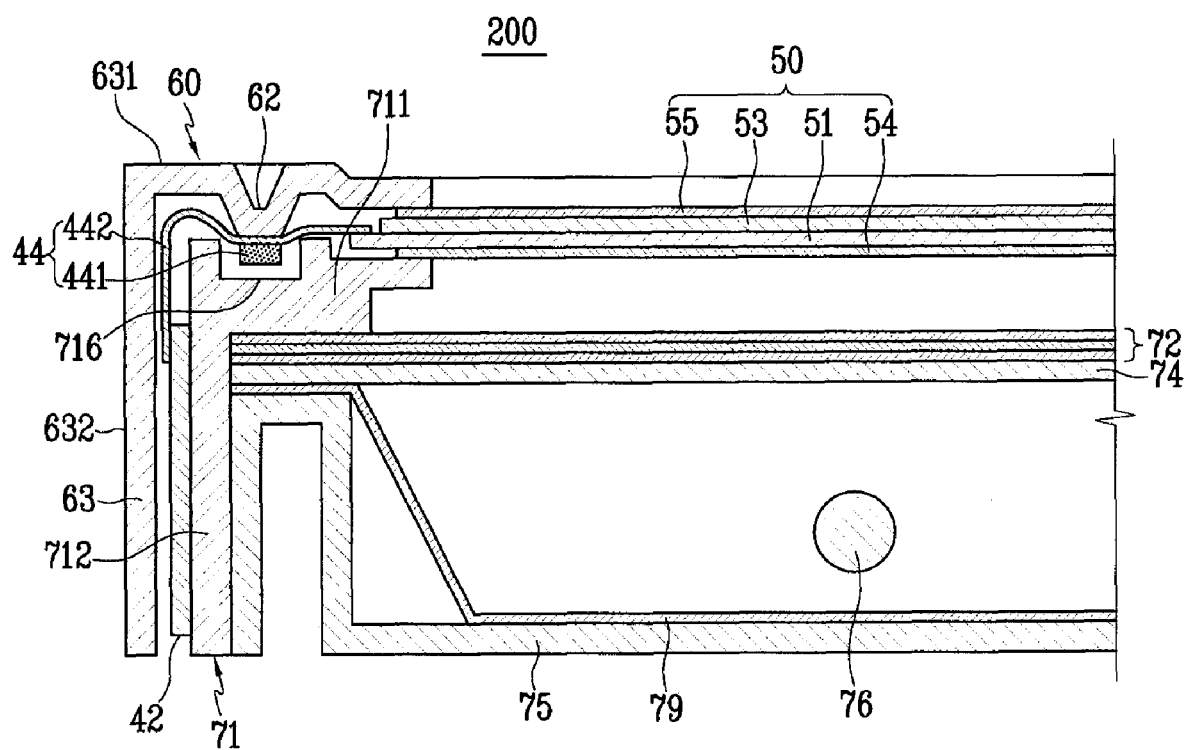
FIG. 6 is a cross-sectional view of an assembled display device taken along line VI-VI of FIG. 5.

Now, a display device 200 according to a second embodiment of the present invention will be described with reference to FIGS. 5 and 6. As illustrated in FIG. 5, the display device 200 according to the second embodiment of the present invention includes a contact heat dissipating portion 62 where a supporting member 60 protrudes from a front portion 631. A supporting frame 71 includes a circuit chip protecting groove 716 formed in a panel supporting portion 711. The structure of the display device 200 according to the second embodiment of the present invention will also be described in detail with reference to FIG. 6. Although the following descriptions focus on the structures of the data driver integrated circuit package 44 and the printed circuit board 42 connected thereto, the gate driver integrated circuit package 43, as shown in FIG. 5, and the printed circuit board 41 connected thereto have the same structure.

The integrated circuit chip 441 is mounted on the base film 442 near a side to which the display panel 50 is connected. Thus, the integrated circuit chip 441 is located between the front portion 631 of the supporting member 60 and the panel supporting portion 711 of the supporting frame 71. The contact heat dissipating portion 62 of the supporting member 60 protrudes from the front portion 631 of the supporting member 60 towards the panel supporting portion 711 of the supporting frame 71 and thereby comes in contact with the base film 442 in an area where the integrated circuit chip 441 is mounted. That is, the contact heat dissipating portion 62 comes in contact with an opposite side of the surface of the base film 442 where the integrated circuit chip 441 is mounted. In addition, the contact heat dissipating portion 62 presses the outer surface of the driver integrated circuit package 44 that is curved to have elasticity. That is, since the contact heat dissipating portion 62 presses the base film 442 having elasticity when the driver integrated circuit package 44 is curved, the contact heat dissipating portion 62 can further closely come in contact with the base film 442 in the area where the integrated circuit chip 441 is mounted. With this structure, heat generated from the integrated circuit chip 441 of the driver integrated circuit package 44 can be effectively dissipated through the contact heat dissipating portion 62 of the supporting member 60.

The supporting frame 71 further includes a circuit chip protecting groove 716 that is formed on a surface facing the contact heat dissipating portion 62 in the panel supporting portion 711 of the supporting frame 71. That is, the circuit chip protecting groove 716 corresponds to the integrated circuit chip 441 of the driver integrated circuit package 44. Thus, the integrated circuit chip 441 of the driver integrated circuit package 44 pressed by the contact heat dissipating portion 62 can be protected against damage caused by collision with the panel supporting portion 711 of the supporting frame 71 when movement occurs inside the display device 200 or when the display device 200 vibrates.

Now, the effect of the present invention will be described in detail through an experimental example embodiment of the present invention. The experimental example of the present invention is only an example, and thus the present invention is not limited thereto.

Experimental Example 1

A display device according to the first embodiment of the present invention, that is, a display device having a supporting member in which a contact heat dissipating portion is formed, was the subject of this experiment. An integrated circuit chip of a driver integrated circuit chip in the display device was brought into contact with a temperature measuring probe to measure the temperature thereof. The display device was operated normally at a specific room temperature (15° C.).

Comparative Example 1

A display device having a general supporting member in which the contact heat dissipating portion is not formed was the subject of this experiment. With the same equipment used in the experimental example 1, the temperature of the integrated circuit chip was measured under the same conditions.

TABLE 1

| | Maximum Temperature (° C.) | Minimum Temperature (° C.) | Average Temperature (° C.) |
|---|---|---|---|
| Experimental Example 1 | 59.5 | 52.1 | 57.4 |
| Comparative Example 1 | 91.9 | 78 | 86.9 |
| Temperature Difference | 32.4 | 25.9 | 29.5 |

Table 1 shows that the display device according to the first embodiment of the present invention effectively dissipates heat generated from the integrated circuit chip under general operating conditions.

Experimental Example 2

Next, the display device according to the first embodiment of the present invention was operated with a full white screen at a specific room temperature (23° C.). When a display device operates with a full white screen, the highest load is imposed on the integrated circuit chip of the driver integrated circuit package.

Comparative Example 2

A display device having a typical supporting member in which the contact heat dissipating portion is not formed was used to measure the temperature of an integrated circuit chip under the same conditions with the same equipment as in the experimental example.

TABLE 2

|  | Maximum Temperature (° C.) | Minimum Temperature (° C.) | Average Temperature (° C.) |
| --- | --- | --- | --- |
| Experimental Example 2 | 78.1 | 64.3 | 73.6 |
| Comparative Example 2 | 117.3 | 96 | 101.2 |
| Temperature Difference | 39.2 | 31.7 | 27.6 |

Table 2 shows that the display device according to the first embodiment of the present invention is very effective in dissipating heat generated from the integrated circuit chip even when the highest load is imposed on the integrated circuit chip.

Experimental Example 3

Finally, the display device according to the first embodiment of the present invention was operated normally inside a chamber at a high temperature (50° C.).

Comparative Example 3

A display device having a typical supporting member in which the contact heat dissipating portion is not formed was used to measure the temperature of an integrated circuit chip under the same conditions with the same equipment as in the experimental example.

TABLE 3

|  | Maximum Temperature (° C.) | Minimum temperature (° C.) | Average Temperature (° C.) |
| --- | --- | --- | --- |
| Experimental Example 3 | 111.4 | 82.1 | 85.9 |
| Comparative Example 3 | 134 | 119.7 | 125 |
| Temperature Difference | 22.6 | 37.6 | 39.1 |

Table 3 shows that the display device according to the first embodiment of the present invention very effectively dissipates heat even under high temperature conditions. The experimental examples of the present invention show that the display device according to the embodiments of the present invention can very effectively dissipate heat generated from the integrated circuit chip of the driver integrated circuit package. As described hereinbefore, a display device according to one or more embodiments of the present invention can effectively dissipate heat generated from a driver integrated circuit package. That is, the heat generated from an integrated circuit chip of the driver integrated circuit package can be effectively dissipated through a contact heat dissipating portion of a supporting member. In addition, since a circuit chip protecting groove is formed in a supporting frame, damage to the integrated circuit chip of the driver integrated circuit package pressed by the contact heat dissipating portion can be prevented due to collision with the supporting frame when movement occurs inside the display device or when the display device vibrates. Further, the heat generated from the integrated circuit chip of a control circuit board can be effectively dissipated.

While the present invention has been shown and described with reference to particular exemplary embodiments thereof, it will be understood by those skilled in the art that various changes in form and details may be made therein without departing from the spirit and scope of the present invention as defined by the appended claims.

What is claimed is:

1. A display device, comprising:
    a display panel configured to display an image;
    a plurality of driver integrated circuit packages that include a base film and an integrated circuit chip mounted on the base film and of which one side is attached to an edge of the display panel; and
    a supporting member that fixedly supports the display panel,
    wherein the supporting member comprises:
        a supporting body that fixedly supports the display panel, and
        a contact heat dissipating portion that protrudes from the supporting body and comes in contact with the driver integrated circuit packages in an area where the integrated circuit chip is formed.

2. The device of claim 1, wherein the contact heat dissipating portion comes in contact with an opposite side of a surface of the base film where the integrated circuit chip is mounted.

3. The device of claim 2, wherein the supporting body comprises:
    a front portion that forms a display window for exposing a front surface of the display panel; and
    a lateral portion that extends from the front portion.

4. The device of claim 3, further comprising:
    a supporting frame that comprises:
        a panel supporting portion that supports edges of the display panel and faces the front portion of the supporting member; and
        a lateral portion that extends from the panel supporting portion and faces the lateral portion of the supporting member.

5. The device of claim 4, wherein the driver integrated circuit packages, which are disposed between the front portion of the supporting member and the panel supporting portion of the supporting frame and between the lateral portion of the supporting member and the lateral portion of the supporting frame, are elastically curved.

6. The device of claim 5, wherein the driver integrated circuit packages include curved outer surfaces, and wherein the contact heat dissipating portions of the supporting member press against the curved outer surfaces of the driver integrated circuit packages.

7. The device of claim 4, wherein the contact heat dissipating portions protrude from the lateral portion of the supporting member towards the lateral portion of the supporting frame so as to come in contact with the base film in an area where the integrated circuit chip is mounted.

8. The device of claim 7, wherein the supporting frame further comprises a circuit chip protecting groove that is formed on a surface of the lateral portion facing the contact heat dissipating portion.

9. The device of claim 4, wherein the contact heat dissipating portion protrudes from the front portion of the supporting member towards the panel supporting portion of the supporting frame so as to come in contact with the base film in an area where the integrated circuit chip is mounted.

10. The device of claim 9, wherein the supporting frame further comprises a circuit chip protecting groove that is formed on a surface of the panel supporting portion facing the contact heat dissipating portion.

11. The device of claim 4, further comprising a printed circuit board connected to a second side of one or more of the plurality of driver integrated circuit packages.

12. The device of claim 11, wherein the printed circuit board is located between the lateral portion of the supporting frame and the lateral portion of the supporting member.

13. A display device, comprising:
  a display panel configured to display an image;
  a receiving member configured to receive a rear surface of the display panel;
  a control circuit board disposed at a rear surface of the receiving member and includes an integrated circuit chip; and
  a cover member configured to join with the receiving member to cover the control circuit board,
  wherein the cover member comprises:
    a cover body; and
    a thermal conductive portion protruding from the cover body towards the control circuit board.

14. The device of claim 13, further comprising a heat dissipating pad located between the thermal conductive portion of the cover member and the integrated circuit chip of the control circuit board.

15. The device of claim 14, wherein the heat dissipating pad has a thickness of between about 0.5 mm to about 2.0 mm.

16. The device of claim 14, wherein the cover member includes a material containing a metal component having high thermal conductivity.

* * * * *